US012687569B2

(12) United States Patent
Lee et al.

(10) Patent No.: US 12,687,569 B2
(45) Date of Patent: Jul. 21, 2026

(54) SECONDARY BATTERY CELL INSULATION TEST APPARATUS FOR SIMULTANEOUS MULTIPLE-POINT INSULATION TESTING AND METHOD USING THE SAME

(71) Applicant: SK On Co., Ltd., Seoul (KR)

(72) Inventors: Jeong Joo Lee, Daejeon (KR); Tak Kyung Yoo, Daejeon (KR); Soo Hwan Jo, Daejeon (KR); Ja Sung Yun, Daejeon (KR); Ha Chul Jeong, Daejeon (KR)

(73) Assignee: SK On Co., Ltd., Seoul (KR)

( * ) Notice: Subject to any disclaimer, the term of this patent is extended or adjusted under 35 U.S.C. 154(b) by 64 days.

(21) Appl. No.: 18/594,265

(22) Filed: Mar. 4, 2024

(65) Prior Publication Data

US 2024/0302425 A1 Sep. 12, 2024

(30) Foreign Application Priority Data

Mar. 10, 2023 (KR) ......................... 10-2023-0031747

(51) Int. Cl.
*G01R 31/12* (2020.01)
*G01R 31/36* (2020.01)

(52) U.S. Cl.
CPC ..... *G01R 31/1272* (2013.01); *G01R 31/3644* (2013.01)

(58) Field of Classification Search
CPC .. G01R 27/025; G01R 31/1272; G01R 31/36; G01R 31/3644; G01R 31/385; G01R 31/389; G01R 31/392; G01R 1/06733; G01R 1/073; G01R 31/12; H01M 10/4285; Y02E 60/10
See application file for complete search history.

(56) References Cited

U.S. PATENT DOCUMENTS

| | | | | |
|---|---|---|---|---|
| 7,847,560 B2 * | 12/2010 | Vokey | ................... | E04D 13/006 |
| | | | | 324/718 |
| 8,742,764 B2 * | 6/2014 | Lee | ..................... | G01R 31/1263 |
| | | | | 324/437 |
| 9,791,420 B2 * | 10/2017 | Holmes | ................ | G01N 29/225 |
| 11,726,120 B2 * | 8/2023 | Kim | ..................... | G01R 27/025 |
| | | | | 324/426 |

(Continued)

FOREIGN PATENT DOCUMENTS

| | | |
|---|---|---|
| KR | 10-2010-0071758 A | 6/2010 |
| KR | 10-2014-0128985 A | 11/2014 |

(Continued)

OTHER PUBLICATIONS

KIPO, Appl. 10-2023-0031747, Office Action, Jun. 9, 2026.

*Primary Examiner* — Vinh P Nguyen

(74) *Attorney, Agent, or Firm* — Jones Day

(57) ABSTRACT

A secondary battery cell insulation test apparatus may include: a first probe portion disposed to be in contact with a case of a secondary battery cell; a second probe portion disposed to be in contact with an electrode tab of the secondary battery cell; and a tester for measuring insulation resistance of the secondary battery cell in a state in which the first probe portion and the second probe portion are disposed to be in contact with the secondary battery cell, wherein the first probe portion is in line contact or surface contact with the case.

11 Claims, 12 Drawing Sheets

(56) References Cited

U.S. PATENT DOCUMENTS

| | | | | |
|---|---|---|---|---|
| 11,768,234 B2 * | 9/2023 | Taniguchi | ......... | H01M 10/0585 |
| | | | | 324/551 |
| 12,066,495 B2 * | 8/2024 | Lee | .................... | G01R 31/3865 |
| 12,206,076 B2 * | 1/2025 | Lee | ........................ | H01M 10/48 |
| 2015/0022228 A1 | 1/2015 | Motohashi et al. | | |

FOREIGN PATENT DOCUMENTS

| | | |
|---|---|---|
| KR | 10-2015-0092854 | 8/2015 |
| KR | 10-2021-0069377 | 6/2021 |
| KR | 10-2021-0090491 | 7/2021 |

* cited by examiner

SECONDARY BATTERY CELL INSULATION TEST APPARATUS FOR SIMULTANEOUS MULTIPLE-POINT INSULATION TESTING AND METHOD USING THE SAME

CROSS-REFERENCE TO RELATED APPLICATION(S)

This patent document claims the priority and benefits of Korean Patent Application No. 10-2023-0031747 filed on Mar. 10, 2023, the disclosure of which is incorporated herein by reference in its entirety.

TECHNICAL FIELD

The present disclosure relates to a secondary battery cell insulation test apparatus and a method using the same.

BACKGROUND

A secondary battery refers to a battery capable of repeated electrical charging and discharging because the mutual conversion between chemical energy and electrical energy is reversible. Such a secondary battery may be used as an energy source for an electric vehicle, a hybrid vehicle, and an energy storage system (ESS), which have recently attracted attention, including a mobile device.

On the other hand, insulation defects of a secondary battery interfere with normal operations thereof, such as causing low voltage, and may seriously cause fire and explosions, and therefore, it may be necessary to remove defective cells in advance by testing insulation defects on a battery cell basis.

FIGS. 1A and 1B are views illustrating examples of success and failure in detecting insulation defects of a pouch cell using a conventional insulation test apparatus.

An insulation test is performed by measuring the insulation resistance between first and second probe portions 22 and 23 through a tester 24 in a state in which the first and second probe portions 22 and 23 of a test apparatus 2 are in contact with a case 11 and a negative pole tab 13 of a pouch cell 1, respectively.

Referring to FIGS. 1A and 1B, the first probe portion 22 and the second probe portion 23 of a conventional test apparatus 2 come into point contact with the pouch cell 1. Accordingly, in order to detect insulation defects that may occur at any point of the case 11, a test must be repeatedly performed while changing a position of the first probe portion 22, and despite repeated performance, there has been a problem in that the probability of detecting insulation defects may be somewhat low.

SUMMARY

According to an aspect of the present disclosure, it is possible to provide a secondary battery cell insulation test apparatus for performing an insulation test at several points simultaneously and an insulation test method using the device.

In an embodiment of the present disclosure, a secondary battery cell insulation test apparatus may include: a first probe portion disposed to be in contact with a case of a secondary battery cell; a second probe portion disposed to be in contact with an electrode tab of the secondary battery cell; and a tester for measuring insulation resistance of the secondary battery cell in a state in which the first probe portion and the second probe portion are disposed to be in contact with the secondary battery cell, wherein the first probe portion may be in line contact or surface contact with the case.

In an embodiment of the present disclosure, the first probe portion may be in the form of a roller or a plate.

In an embodiment of the present disclosure, the first probe portion may be disposed on at least one surface of the case.

In an embodiment of the present disclosure, the secondary battery cell insulation test apparatus may further include: a transfer portion for transferring at least one of the secondary battery cell, the first probe portion, and the second probe portion.

In an embodiment of the present disclosure, the first probe portion may be formed to have a length equal to or longer than a length of the case in a width direction of the case.

In an embodiment of the present disclosure, the secondary battery cell insulation test apparatus may further include: a cell jig on which the secondary battery cell is settled.

In an embodiment of the present disclosure, the secondary battery cell insulation test apparatus may further include: a capturing portion for confirming and specify an insulation defect position in the secondary battery cell.

In an embodiment of the present disclosure, the secondary battery cell in contact with the first probe portion and the second probe portion may be a pouch-type secondary battery cell.

In an embodiment of the present disclosure, a cell insulation test method may include: a contact operation of bring a case and an electrode tab of a secondary battery cell into contact with a first probe portion and a second probe portion, respectively; a voltage application operation of applying a test voltage to the secondary battery cell in a state in which the first probe portion and the second probe portion are in contact with the secondary battery cell; a defect detection operation of determining whether defects are present in the secondary battery cell by measuring an insulation resistance value of the secondary battery cell; and a moving operation of moving one of the secondary battery cell and the first probe portion, wherein the first probe portion may be in line contact or surface contact with the case, and the operations may be repeatedly performed until an insulation test of the secondary battery cell is completed.

In an embodiment of the present disclosure, the first probe portion may be disposed on at least one surface of the case.

In an embodiment of the present disclosure, the first probe portion may move in at least one of a longitudinal direction and a width direction of the case while maintaining contact with the case.

In an embodiment of the present disclosure, the cell insulation test method may further include, before the contact operation, applying an insulation test liquid to the case in contact with the first probe portion.

In an embodiment of the present disclosure, the cell insulation test method may further include, when the secondary battery cells are provided in plural form in one direction, moving the second probe portion.

In an embodiment of the present disclosure, the first probe portion may be formed to have a length equal to or longer than a length of the case in a width direction of the case.

In an embodiment of the present disclosure, the plurality of secondary battery cells may be disposed in a width direction of the secondary battery cells.

In an embodiment of the present disclosure, in the defect detection operation, when an insulation resistance value of the secondary battery cell is measured to be lower than a preset reference value, the secondary battery cell may be determined to have insulation defects.

In an embodiment of the present disclosure, the secondary battery cell insulation test method may further include, when the secondary battery cell is determined to have insulating defects, a position specifying operation of specifying an insulating defect position of the secondary battery cell through a capturing portion.

According to an aspect of the present disclosure, the reliability of an insulation test may be increased, and the time required for the test may be significantly saved. In addition, since it is possible to detect partial insulation damage in addition to serious insulation defects of a cell, the possibility of shipping a defective cell may be reduced.

BRIEF DESCRIPTION OF DRAWINGS

Certain aspects, features, and advantages of the disclosed disclosure are illustrated by the following detailed description with reference to the accompanying drawings.

DETAILED DESCRIPTION

Hereinafter, the disclosed disclosure will be described in detail with reference to the accompanying drawings. However, this is merely illustrative and the disclosed disclosure is not limited to the specific embodiments described exemplarily.

The disclosed disclosure relates to a secondary battery cell insulation test apparatus and a test method using the same, and first, referring to FIGS. 2 to 5, a secondary battery cell insulation test apparatus 200 (hereinafter, a cell insulation test apparatus or test apparatus) according to the disclosed disclosure will be described.

Figure 1A:
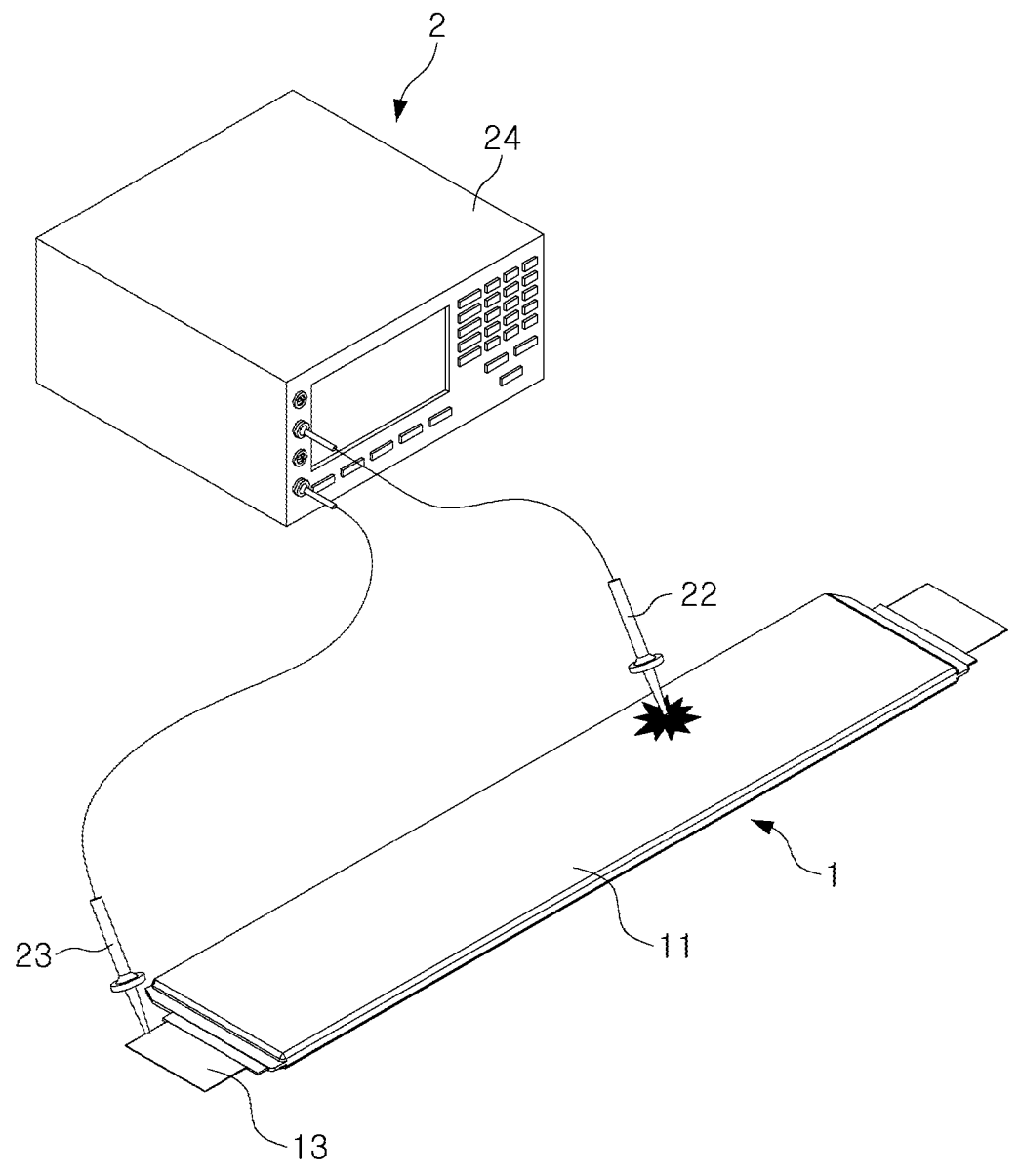
FIGS. 1A and 1B are views illustrating examples of success and failure in detecting insulation defects of a pouch cell using a conventional insulation test apparatus.
Figure 1B:
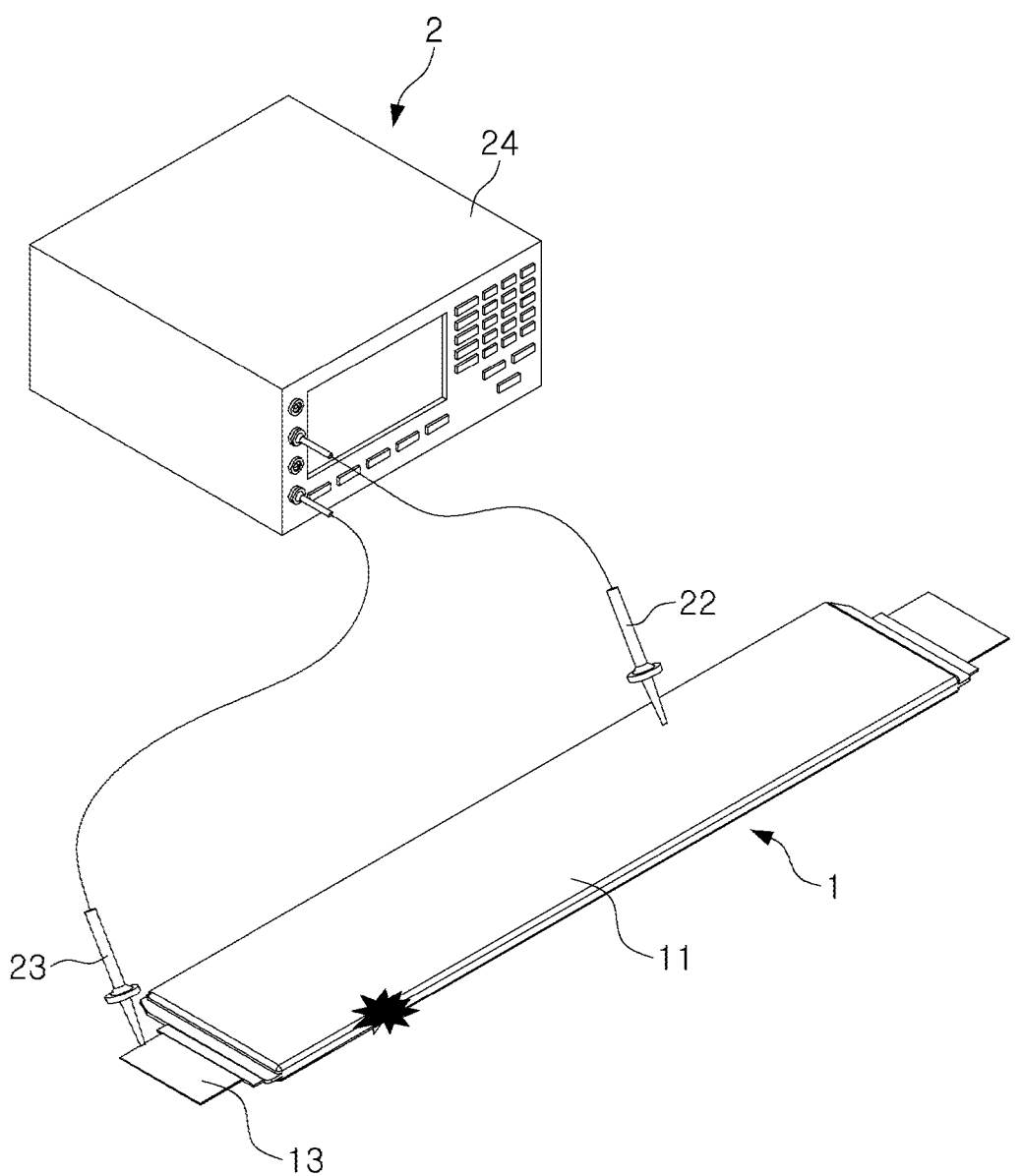
Figure 2:
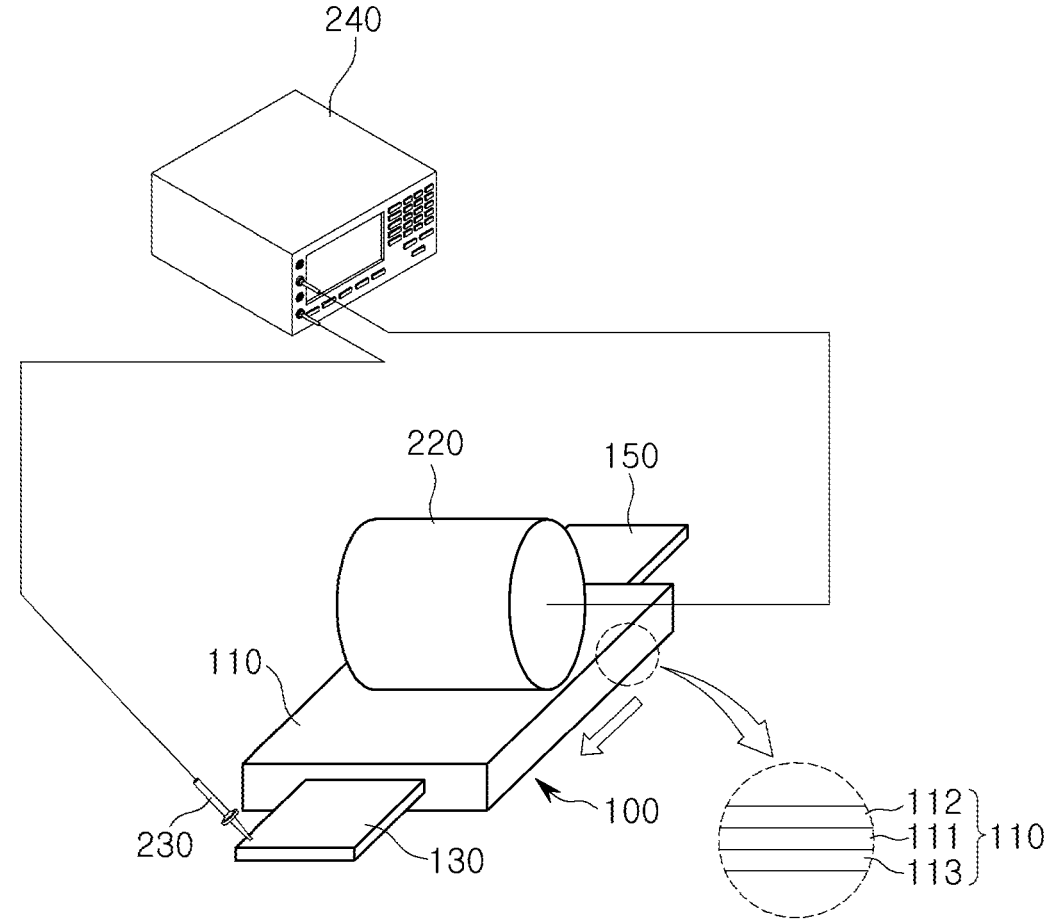
FIG. 2 is a view illustrating a setting state of a test apparatus according to an embodiment.
Figure 3A:
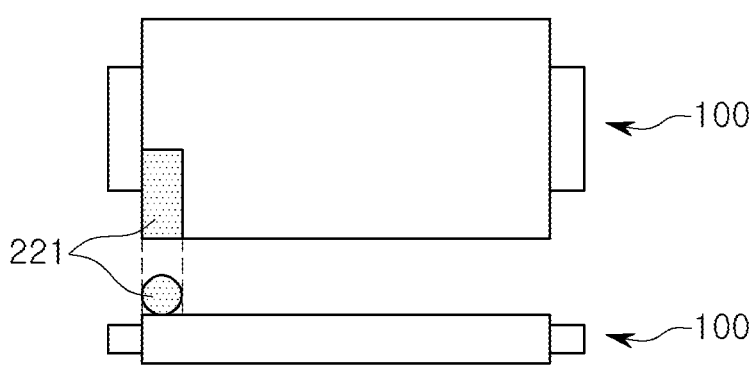
FIGS. 3A and 3B are cross-sectional views of a first probe portion according to embodiments.
Figure 3B:
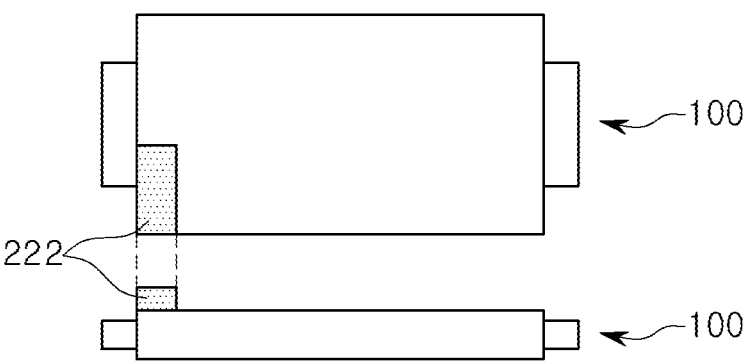

FIG. 2 is a view illustrating a setting state of a test apparatus according to an embodiment, and FIGS. 3A and 3B are views illustrating a cross-section of a first probe portion according to embodiments.

The cell insulation test apparatus 200 according to the disclosed embodiment may include a first probe portion 220 and a second probe portion 230 brought into contact with a secondary battery cell 100, and a tester 240 measuring insulation resistance. Furthermore, the cell insulation test apparatus 200 may include a transfer portion (not illustrated) transferring at least one of the secondary battery cell 100, the first probe portion 220, and the second probe portion 230. Furthermore, the cell insulation test apparatus 200 may further include a cell jig (not illustrated) on which a secondary battery cell is settled, and one or more capturing portions (not illustrated) that images a test process.

The secondary battery cell may be divided into a pouch type, a prismatic type, and a cylindrical type according to an appearance thereof, all of which may be subject to an insulation test using the cell insulation test apparatus 200 according to the disclosed embodiment. In the present specification and the drawings, a pouch-type secondary battery cell (hereinafter, a pouch cell) is described as an example, but the spirit of the disclosed embodiment is not limited thereto. For example, the insulation test may be performed on a prismatic cell and a cylindrical cell using the same test apparatus.

Referring to FIGS. 2 to 5, the secondary battery cell to be subjected to the insulation test may be a pouch cell 100. The pouch cell 100 may refer to a secondary battery cell in which a case accommodating an electrode assembly and an electrolyte has a pouch shape.

A case 110 of the pouch cell 100 may have insulating layers 112 and 113 stacked on both surfaces of a metal layer 111. For example, the metal layer 111 may be formed of aluminum, and the insulating layers 112 and 113 may be formed of polyethylene terephthalate (PET) or polypropylene (PP). However, the insulating layers 112 and 113 may be replaced with other materials having similar properties to those listed above.

The metal layer 111 may be electrically insulated from an exterior thereof by the insulating layers 112 and 113. However, the insulation of the pouch cell 100 may be lost due to damage to an internal structure or damage to the insulating layers 112 and 113, and the cell insulation test apparatus 200 according to the disclosed embodiment may detect such insulation defects.

The pouch cell 100 may be provided in various forms, but in an embodiment, as illustrated in the drawing, the pouch cell 100 may have a shape in which electrode tabs 130 and 150 are exposed on both sides of the case 110 in a longitudinal direction. The electrode tabs 130 and 150 are connect to negative electrode and positive electrode of an electrode assembly (not illustrated) accommodated in the case 110. A negative electrode tab 130 may extend from the negative electrode end, and a positive electrode tab 150 may extend from the positive electrode end.

Although not illustrated in the drawing, the pouch cell 100 may be settled so as to be aligned on the cell jig. In an embodiment, the cell jig may include an opening that exposes a wide surface of the case 110. Accordingly, the first probe portion 220 may be disposed to be in contact with the case 110 through the opening, and may be moved while coming into contact with the case 110. Details related thereto will be described below.

The first probe portion 220 and the second probe portion 230 may be disposed to come into contact with the pouch cell 100 while being connected to a tester 240. Referring to the drawing, the first probe portion 220 may be in contact with the case 110 and the second probe portion 230 may be in contact with the negative electrode tab 130.

The second probe portion 230 may include a single probe that is in point contact with the negative electrode tab 130. On the other hand, the first probe portion 220 may be in line contact or surface contact with the case 110. For example, line contact may be implemented by infinitely arranging probes of the second probe portion 230 in a row within a certain length, and surface contact may be implemented by arranging the line contact infinitely within a certain length.

As illustrated in FIGS. 3A and 3B, the first probe portion 220 may be in the form of a roller 221 or a plate 222. For example, when the first probe portion 220 is provided as the roller 221, the first probe 220 may form line contact with the case 110, and when the first probe 220 is provided as a plate 222, the first probe 220 may form surface contact with the case 110.

In an embodiment of the present disclosure, the first probe portion 220 may include an insulating cover (not illustrated) on which the roller 221 or the plate 222 is disposed. The insulating cover is formed of a material with rigidity and insulating properties, thus supporting the roller 221 or the plate 222, and preventing unintentional energization situations during an insulation test. However, the roller 221 or plate 222 does not necessarily need to be disposed on the insulating cover.

Figure 5:
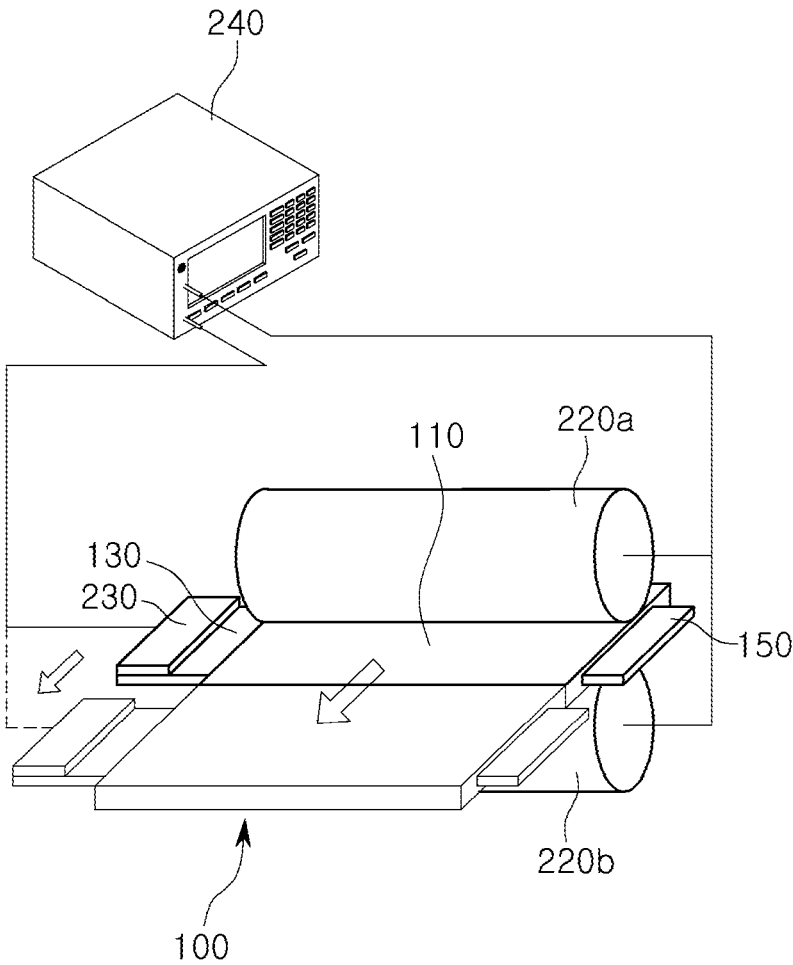

According to the disclosed embodiment, the cell insulation test apparatus 200 may further include a transfer portion. The transfer portion may transfer at least one of the secondary battery cell 100, the first probe portion 220, and the second probe portion 230. In detail, according to the disclosed embodiment, the transfer portion may transfer any one of the secondary battery cell 100 and the first probe portion 220, and may selectively transfer the second probe portion 230 only when an insulation test is continuously performed on a plurality of pouch cells 100 as illustrated in FIG. 5.

Referring to FIG. 2, one of the secondary battery cell 100 and the first probe portion 220 may move relative to the other thereof in one direction, and such a movement may be implemented by the transfer portion. In the drawing, an arrow may correspond to a transfer direction of the secondary battery cell 100 or the first probe portion 220.

Meanwhile, according to the disclosed embodiment, the first probe portion 220 may be disposed on at least one surface of the case 110. That is, one or more first probe portions 220 may be provided and may be disposed to come into contact with the case 110 on one surface or both surfaces of the case 110.

Furthermore, according to the disclosed embodiment, an insulation test liquid may be applied to the case 110 in which the first probe portion 220 is disposed. Even if the first probe portion 220 is not in direct contact with a surface of the case 110, the first probe portion 220 may detect insulation defects in the secondary battery cell 100 through the insulation test liquid.

Figure 4:
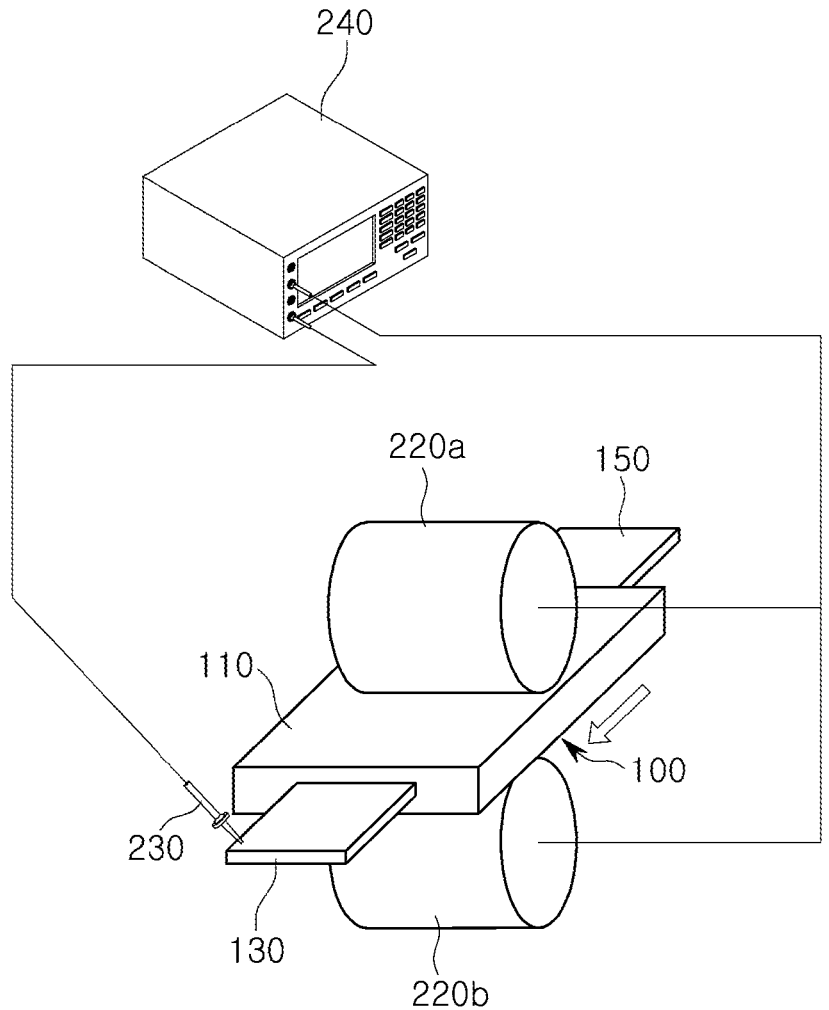
FIGS. 4 and 5 are views illustrating a modified embodiment of the test apparatus illustrated in FIG. 2.

FIGS. 4 and 5 are views illustrating modified embodiments of the test apparatus illustrated in FIG. 2.

Referring to FIGS. 4 and 5, the cell insulation test apparatus 200 may include two first probe portions 220. In the drawings, an embodiment in which the first probe portion 220 is a roller 221 is illustrated, but the first probe 220 may be a plate 222.

The two first probe portions 220a and 220b may be connected in parallel with the tester 240, and one may be disposed on one surface of the case 110, and the other may be disposed on the other surface of the case 110. Accordingly, an insulation test may be performed simultaneously on both surfaces of the case 110, and test time may be shortened.

Additionally, in FIG. 4, the two first probe portions 220a and 220b may move between a negative electrode tab 130 and a positive electrode tab 150, but in FIG. 5, the two first probe portions 220a and 220b may move in a direction, parallel to the negative electrode tab 130 and the positive electrode tab 150. In FIG. 5, after disposing a plurality of pouch cells 100 in a moving direction of the first probe portion 220, there is an advantage in that the insulation test may be performed continuously on the plurality of pouch cells 100.

According to the disclosed embodiment, in the cell insulation test apparatus 200, the first probe portion 220 may be in line or surface contact with the case 110, and the insulation test may be performed on an entire surface of the case 110 by moving the pouch cell 100 or the first probe 220, and therefore, the detection probability of the insulation defect that may occur at any point of the pouch cell 100 may be increased. Furthermore, since the plurality of pouch cells 100 can be tested continuously, the time required for the test may be reduced.

Meanwhile, sparks may occur at points in which insulation defects are present in the pouch cell 100. The cell insulation test apparatus 200 according to the disclosed embodiment may further include a capturing portion (not illustrated) that confirms and specifies a spark generation position (i.e., an insulation defect position). The spark generation position may be confirmed with the naked eye, but when confirmed through the capturing portion, a process of specifying the insulation defect position may be automated.

For example, the capturing portion may be a camera, and the number and position of the capturing portion may be freely determined.

Figure 6:
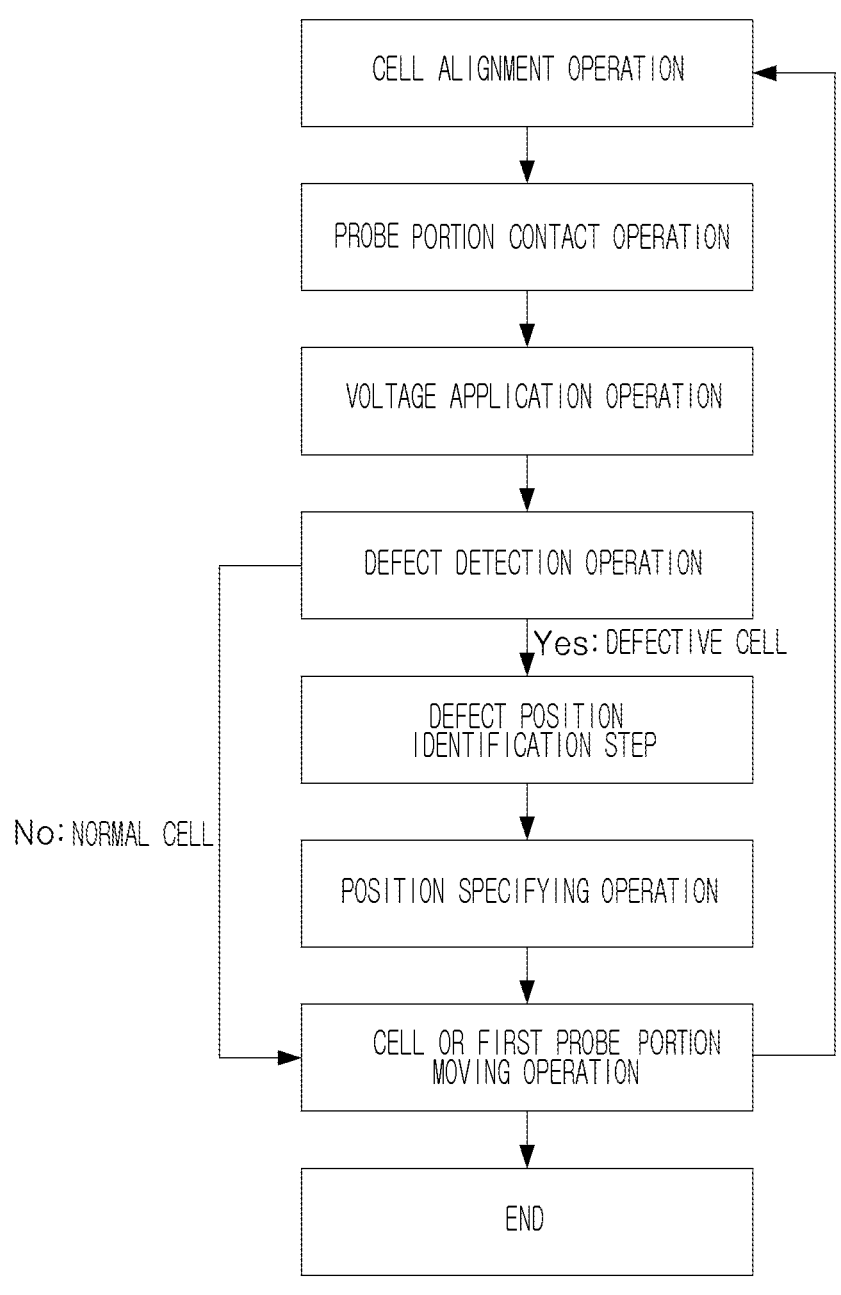
FIG. 6 is a diagram illustrating a cell insulation test procedure using a test apparatus according to an embodiment-.
Figure 7A:
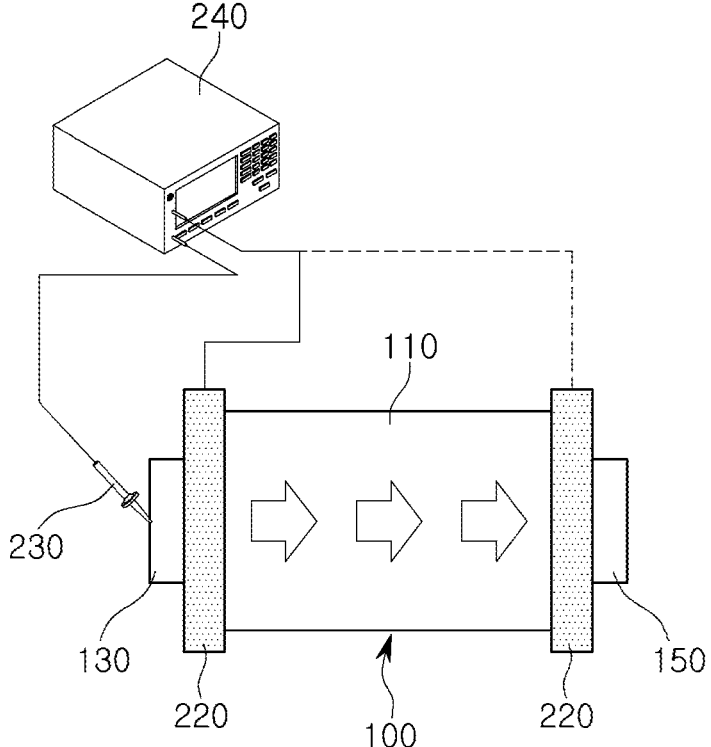
FIGS. 7A and 7B are views illustrating embodiments of a test apparatus to which a test procedure according to FIG. 6 is applied.
Figure 7B:
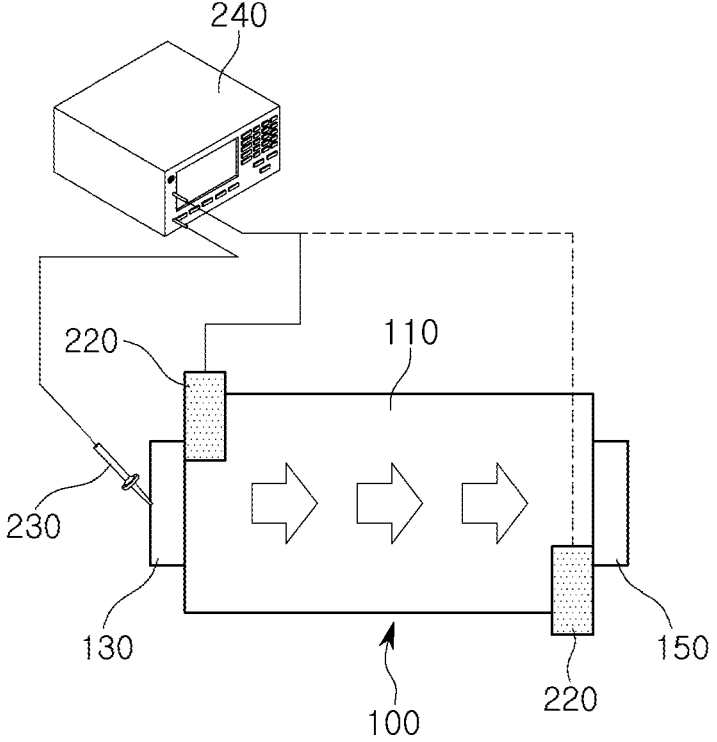
Figure 8:
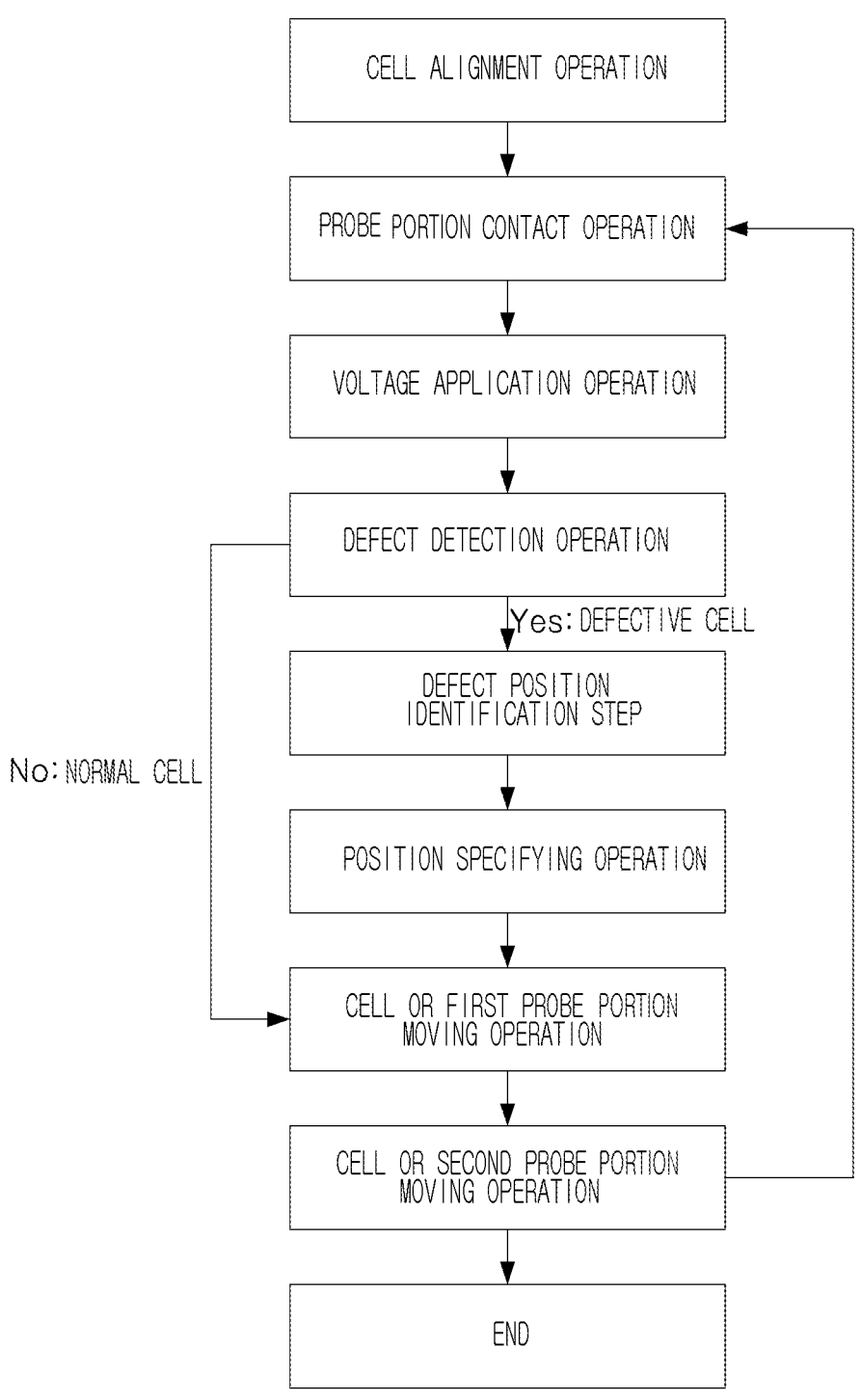
FIG. 8 is a view illustrating a cell insulation test procedure using a test apparatus according to another embodiment.
Figure 9:
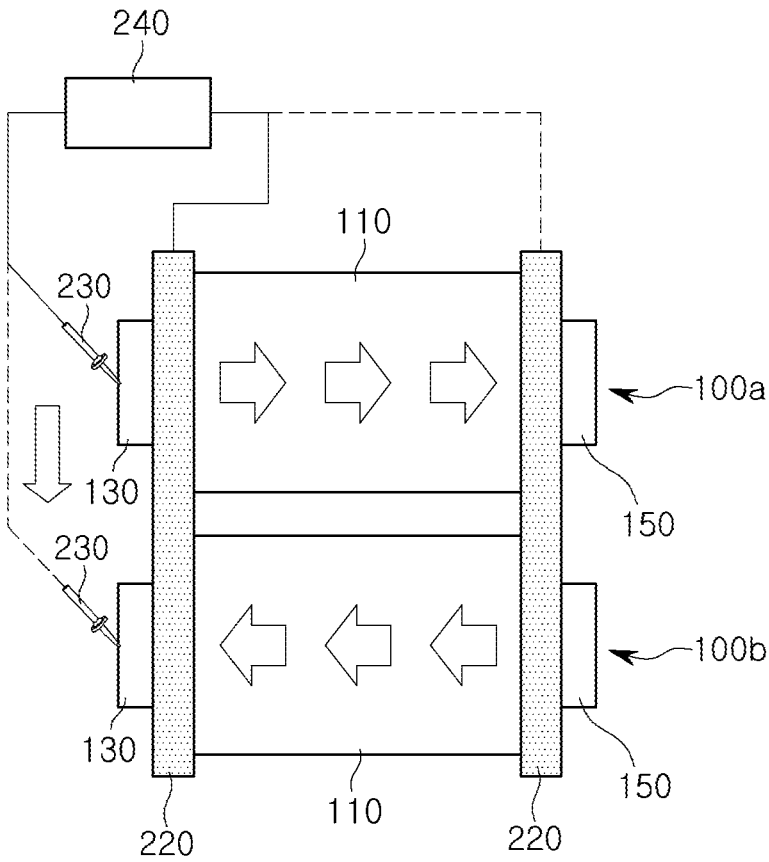
FIG. 9 is a view illustrating an embodiment of a test apparatus to which a test procedure according to FIG. 8 is applied.

FIG. 6 is a view illustrating a cell insulation test procedure using a test apparatus according to an embodiment, and FIGS. 7A and 7B are views illustrating embodiments of a test apparatus to which a test procedure according to FIG. 6 is applied. Furthermore, FIG. 8 is a view illustrating a cell insulation test procedure using a test apparatus according to another embodiment, and FIG. 9 is a view illustrating an embodiment of a test apparatus to which a test procedure according to FIG. 8 is applied.

In order to perform the insulation test of a pouch cell 100, a position of the pouch cell 100 may first be aligned. As an example, the pouch cell 100 may be settled and aligned on a cell jig. After aligning the position of the pouch cell 100, a first probe portion 220 and a second probe portion 230 may be brought into contact with a case 110 and a negative electrode tab 130 of the pouch cell 100, respectively, and insulation defects in the pouch cell 100 may be detected by applying test voltage through a tester 240. Through the test, the pouch cell 100 in which no insulation defects are detected may be immediately classified as a normal cell or may be inspected once more by increasing the test voltage.

Meanwhile, the pouch cell 100 in which insulation defects are detected through the test may be classified as a defective cell and undergo some further procedures.

When the pouch cell 100 has insulation defects, an insulation resistance value of the pouch cell 100 may be measured to be significantly low as compared to a normal cell. The insulation resistance value may be calculated through Equation 1 below.

$$R_{total} = \cfrac{1}{\cfrac{1}{R1} + \cfrac{1}{R2} + \cfrac{1}{R3} + \cdots} \qquad \text{Equation 1}$$

Normal cells or defective cells may be classified based on the insulation resistance value calculated through Equation 1 above, and a value that serves as classification standard may be set differently according to test conditions or the like.

In the case of the pouch cell 100 having insulating defects, when test voltage is applied, sparks may occur at a defect position as described above. The spark generation position may be identified and specified through the capturing portion. Furthermore, a repair procedure for solving the insulation defects may be further performed.

According to the disclosed embodiment, the above-described operations may be repeatedly performed while moving one of the pouch cell 100 and the first probe portion 220 until the insulation test of the pouch cell 100 is completed. For example, the first probe portion 220 may move relative to the pouch cell 100 during the insulation test.

Referring to FIGS. 7A and 7B, the first probe portion 220 may move between a negative electrode tab 130 and a positive electrode tab 150 of the pouch cell 100 or in at least one of a longitudinal direction and a width direction of the pouch cell 100 while maintaining contact with the case 110 during the insulation test. For example, in FIG. 7A, the first probe portion 220 may be moved in the longitudinal direction of the pouch cell 100, and, and in FIG. 7B, the first probe portion 220 may be moved in the longitudinal direction and the width direction of the pouch cell 100.

Furthermore, the first probe portion 220 may be disposed on at least one surface of the case 110, that is, one surface or both surfaces of the case 110. When the first probe portion 220 is disposed on both surfaces of the case 110, insulation tests may be simultaneously performed on both surfaces of the pouch cell 100.

Furthermore, according to the disclosed embodiment, before the operation of bringing the first probe portion 220 into contact with the case 110, an operation of applying an insulation test liquid to the case 110 may be additionally performed. The first probe portion 220 may detect insulation defects of the secondary battery cell 100 through the insulation test liquid even if the first probe portion 220 is not in direct contact with a surface of the case 110.

Meanwhile, according to the disclosed embodiment, the above-described cell insulation test apparatus 200 may continuously perform tests on a plurality of pouch cells 100, and when the insulation tests are continuously performed on the plurality of pouch cells 100, an operation of moving the pouch cell 100 or the second probe portion 230 may be further included. This operation may be performed after moving the pouch cell 100 or the first probe portion 220.

For example, when the first and second probe portions 220 and 230 are moved instead of the pouch cell 100, the first probe portion 220 is moved on the case 110 of a specific pouch cell 100, the second probe portion 230 may be moved from a negative electrode tab 130 of one pouch cell 100 to come into contact with a negative electrode tab 130 of another pouch cell 100. That is, when the insulation test on one pouch cell 100 is completed, the second probe portion 230 may move to a next pouch cell 100, and an insulation test for the next pouch cell 100 may be continuously performed.

The plurality of pouch cells 100 may be disposed in a width direction so that electrode tabs are not adjacent to each other for continuous tests, as illustrated in FIG. 9. In a state in which the plurality of pouch cells 100 are arranged in this manner, the first probe portion 220 may be moved in a length direction or a width direction of the pouch cell 100.

According to the disclosed embodiment, the first probe portion 220 may be formed to have a length equal to or longer than a length of the case 110 in a width direction of the case 110, and may be moved in a longitudinal direction of the pouch cell 100 during the test.

However, the disclosed embodiment is not limited thereto, as needed, the first probe portion 220 may be moved in the width direction of the pouch cell 100.

Although the configurations and characteristics of the present disclosure have been described based on the example embodiment of the present disclosure, the present disclosure is not limited thereto, and it will be apparent to those skilled in the art to which the present disclosure belongs that various changes or modifications may be made within the concept and scope of the present disclosure, and thus it will be revealed that such changes or modifications fall within the scope of the appended claims.

What is claimed is:

1. A secondary battery cell insulation test apparatus, comprising:
   a first probe portion disposed to be in contact with a case of a secondary battery cell;
   a second probe portion disposed to be in contact with an electrode tab of the secondary battery cell; and
   a tester for measuring insulation resistance of the secondary battery cell in a state in which the first probe portion and the second probe portion are disposed to be in contact with the secondary battery cell,
   wherein the first probe portion is in line contact or surface contact with the case,
   wherein the first probe portion comprises two probe portions connected in parallel with the tester, and
   wherein the two probe portions are respectively disposed on both surfaces of the case and perform insulation testing simultaneously on both surfaces of the case.

2. The secondary battery cell insulation test apparatus of claim 1, wherein the first probe portion is in the form of a roller or a plate.

3. The secondary battery cell insulation test apparatus of claim 1, wherein the first probe portion is formed to have a length equal to or longer than a length of the case in a width direction of the case.

4. The secondary battery cell insulation test apparatus of claim 1, wherein the secondary battery cell is a pouch-type secondary battery cell.

5. A secondary battery cell insulation test method, comprising:
   a disposing operation of disposing a plurality of secondary battery cells in a moving direction of the first probe portion;
   a contact operation of bringing a case and an electrode tab of a secondary battery cell among the plurality of secondary batter cells into contact with the first probe portion and a second probe portion, respectively;
   a voltage application operation of applying a test voltage to the secondary battery cell in a state in which the first probe portion and the second probe portion are in contact with the secondary battery cell;
   a defect detection operation of determining whether defects are present in the secondary battery cell by measuring an insulation resistance value of the secondary battery cell;
   a moving operation of moving the first probe portion; and
   a moving operation of moving the second probe portion from the electrode tab of the secondary battery cell to come into contact with an electrode tab of another secondary battery cell,
   wherein the first probe portion is in line contact or surface contact with the case, and
   the operations are repeatedly performed until an insulation test of the plurality of secondary battery cells is completed.

6. The secondary battery cell insulation test method of claim 5, wherein the first probe portion is disposed on at least one surface of the case.

7. The secondary battery cell insulation test method of claim 5, wherein the first probe portion moves in at least one of a longitudinal direction and a width direction of the case while maintaining contact with the case.

8. The secondary battery cell insulation test method of claim 7, further comprising:

before the contact operation, applying a conductive insulation test liquid to the case in contact with the first probe portion.

9. The secondary battery cell insulation test method of claim 7, wherein the first probe portion is formed to have a length equal to or longer than a length of the case in a width direction of the case.

10. The secondary battery cell insulation test method of claim 5, wherein the plurality of secondary battery cells are disposed in a width direction of the secondary battery cells.

11. The secondary battery cell insulation test method of claim 5, wherein in the determination operation, when an insulation resistance value of the secondary battery cell is measured to be lower than a preset reference value, the secondary battery cell is determined to have insulation defects.

\* \* \* \* \*